United States Patent [19]

Puri et al.

[11] Patent Number: 5,132,567

[45] Date of Patent: Jul. 21, 1992

[54] LOW THRESHOLD BICMOS CIRCUIT

[75] Inventors: Yogi K. Puri, Vienna; Raymond A. Schulz, Manassas, both of Va.

[73] Assignee: International Business Machines Corporation, Armonk, N.Y.

[21] Appl. No.: 687,341

[22] Filed: Apr. 18, 1991

[51] Int. Cl.⁵ .............................................. H03K 19/01
[52] U.S. Cl. ..................................... 307/446; 307/443; 307/570
[58] Field of Search ................ 307/443, 446, 451, 454, 307/570, 270

[56] References Cited

U.S. PATENT DOCUMENTS

| | | | |
|---|---|---|---|
| 4,616,146 | 10/1986 | Lee et al. | 307/446 |
| 4,694,203 | 9/1987 | Uragami et al. | 307/446 |
| 4,719,373 | 1/1988 | Masuda et al. | 307/446 |
| 4,733,110 | 3/1988 | Hara et al. | 307/446 |
| 4,808,850 | 2/1989 | Masuda et al. | 307/446 |
| 4,845,385 | 7/1989 | Ruth, Jr. | 307/446 |
| 4,851,713 | 7/1989 | Lee | 307/446 |
| 4,890,017 | 12/1989 | Masuda et al. | 307/446 |
| 4,926,069 | 5/1990 | Yamazaki | 307/446 |
| 4,985,645 | 1/1991 | Tsutsui | 307/570 X |
| 4,999,523 | 3/1991 | Cham et al. | 307/570 |
| 5,027,009 | 6/1991 | Urakawa et al. | 307/446 |
| 5,034,628 | 7/1991 | Matsuzawa et al. | 307/570 X |
| 5,047,669 | 9/1991 | Iwamura et al. | 307/446 |
| 5,059,821 | 10/1991 | Murabayashi et al. | 307/446 X |

FOREIGN PATENT DOCUMENTS 2217941 1/1989 United Kingdom .

Primary Examiner—David Hudspeth
Attorney, Agent, or Firm—Mark A. Wurm

[57] ABSTRACT

A BiCMOS NAND circuit is disclosed employing low threshold n-channel FET transistors in conjunction with standard threshold n-channel FET transistors and standard threshold p-channel FET transistors. Circuit performance is maintained as the circuit devices are scaled to physically smaller FET devices and reduced power supply voltage. Furthermore, the circuit is interface compatible with standard CMOS circuits.

4 Claims, 4 Drawing Sheets (STATE OF THE ART)

LOW THRESHOLD BICMOS CIRCUIT

BACKGROUND OF THE INVENTION

1. Technical Field

The invention disclosed broadly relates to integrated circuit technology and more particular relates to an improved scaled BiCMOS circuit.

2. Background Art

As BiCMOS technology scales to smaller physical dimensions, so does the maximum power supply voltage $V_{dd}$ for reliable circuit operation. For example, a one micron BiCMOS technology will support 5 volts across the MOS devices, but in a one-fourth micron BiCMOS technology circuit power supply volta $V_{dd}$ is limited to approximately 2.5 volts. At lower power supply levels the performance of the conventional BiCMOS circuit of FIG. 1 fails to keep pace with the improvements which can be realized by the FET devices themselves. This occurs because the bipolar transistor $V_{BE}$ does not get smaller when the physical dimensions of the bipolar devices are reduced. The large $V_{BE}$ of the bipolar transistor delays and reduces the input drive of the circuit because less of the input signal is available as overdrive.

Furthermore, the conventional BiCMOS circuit of FIG. 1 fails to provide a full $V_{dd}$ level when the output is high. This results in an inferior noise margin, and makes it difficult or even impossible to use the circuit when it is desired to mix it with conventional CMOS circuit functions on the same integrated circuit chip.

A circuit that overcomes one of the limitations of the circuit of FIG. 1 is disclosed in FIG. 2. This circuit achieves good performance at low power supply voltages, but it is not CMOS compatible. This circuit achieves a performance gain by operating it from a power supply which is higher by one $V_{BE}$ than the $V_{dd}$ of the circuit shown in FIG. 1. This configuration does not impose any additional voltage stress on any of the FET devices even though the power supply is higher. Output clamping devices have been included to render the circuit insensitive to noise coupled to the output line.

Diode connected bipolar transistor Q4 raises the FET sources by a voltage $V_{BE}$. The standard output down-level is $V_{BE}$ instead of ground, and the output up-level is $V_{dd}$ minus $V_{BE}$. Circuit performance is improved over conventional designs because the drive level is increased.

Bipolar device Q3 acts as a clamp to prevent a down level output from being driven negatively into a high impedance condition by noise on the output line. Likewise, bipolar device Q5 clamps the output to $V_{dd}$ minus $V_{BE}$ in the output up-level state when noise would otherwise act to drive the circuit upward into a high impedance condition. Such excursions would otherwise overstress some of the FET devices for long periods of time under certain operational conditions. Under normal conditions Q3 lightly conducts when the circuit output is a down-level, and Q5 lightly conducts when the circuit output is an up-level. The amount of conduction depends upon the setting of the reference voltages VR1 and VR2. Noise causes the clamp devices to conduct heavily, absorbing the energy and quickly clamping the output voltage. Reference voltages VR1 and VR2 are readily generated by conventional circuit means, and will typically be shared by several circuits on a chip.

In an all-BiCMOS circuit environment this circuit will work reasonably well, but it does not interface directly with conventional CMOS circuits which may be on the same chip.

OBJECTS OF THE INVENTION

It is therefore an object of the invention to provide an improved BiCMOS circuit which allows the power supply voltage to be reduced without giving up circuit performance as the circuit is made physically smaller.

It is another object of the invention to minimize the power needed to operate a BiCMOS circuit.

It is yet another object of the invention to provide a BiCMOS circuit which is directly interfaceable with a conventional CMOS circuit.

It is yet another object of the invention to provide a BiCMOS circuit at an increased noise margin.

SUMMARY OF THE INVENTION

These and other objects, features and advantages of the invention are accomplished by a novel BiCMOS NAND circuit employing low threshold n-channel FET transistors in conjunction with standard threshold n-channel FET transistors and standard threshold p-channel FET transistors. The circuit performance does not degrade significantly when the power supply voltage is reduced to accomodate physically smaller FET devices. Furthermore, the input and output signal levels of the circuit, being full rail-to-rail voltage levels, are compatible with standard CMOS circuits.

BRIEF DESCRIPTION OF THE DRAWINGS

These and other objects, features and advantages of the invention will be more fully appreciated with reference to the accompanying figures.

DESCRIPTION OF THE BEST MODE FOR CARRYING OUT THE INVENTION

FIG. 3 shows a 2-input NAND version of the inventive circuit. Transistors N1, N2, N6, and N7 are standard n-channel field effect transistors which have threshold voltages of approximately 0.4 volts. Transistors P1, P2, and P4 are standard p-channel field effect transistors which have threshold voltages of approximately 0.5 volts. Transistors N3, N4, and N5 are low threshold n-channel field effect transistors which have threshold voltages between $-0.25$ and $+0.05$ volts. Transistors N1, N2, P1, and P2 comprise a conventional CMOS 2-input NAND circuit 10. Inverter 16 is a conventional CMOS circuit which uses a pair of standard threshold devices. Bipolar junction transistors Q1 and Q2 comprise a push-pull output stage 12 which provides the capability of driving a capacitive output load rapidly from one state to the other.

If either the A or B (or both) input signal is a down level (near ground) the base of transistor Q2 will approach $V_{dd}$, causing the circuit output to go high. Transistor Q2 acts as an emitter follower, and is capable of providing a large current to rapidly charge up the output load. Bleed transistor N5 conducts a small current which pulls the base of transistor Q1 near ground, keeping bipolar transistor Q1 off. Low threshold FETs N3 and N4 are essentially off, and transistors N6 and N7 remain off in this state. If transistor P4 was not present, the final output voltage level would become Vdd-VBE. However, in this state, inverter 16 provides a down-level drive to the gate terminal of P4 which turns it on. Thus P4 provides a path to rapidly charge the output voltage completely to $V_{dd}$.

If A and B are both up levels (near $V_{dd}$) the base of transistor Q2 will be pulled to ground and the device will shut off. Low threshold FETs N3 and N4 will conduct, allowing bipolar transistor Q1 to turn on and rapidly discharge the output load. The small current through bleed transistor N5 is provided by the N3-N4 path and does not shut off transistor Q1. Inverter 16 provides an up-level to the gate terminal of P4 which turns it off. If transistors N6 and N7 were not present, the final output voltage would slowly drift to ground. However, in this state transistors N6 and N7 both conduct, providing a path to rapidly discharge the output voltage completely to ground. These devices also contribute to the output-falling delay improvement of the circuit.

When the input signals make low-to-high transitions, transistors N3 and N4 cannot begin to turn on until the input gets to at least $V_{BE}$ plus the N3 or N4 threshold. This delays the start of the output falling transition. A feature of this invention is that this delay is minimized because the low thresholds of the N3 and N4 devices allow them to conduct sooner than conventional devices would.

Figure 1:
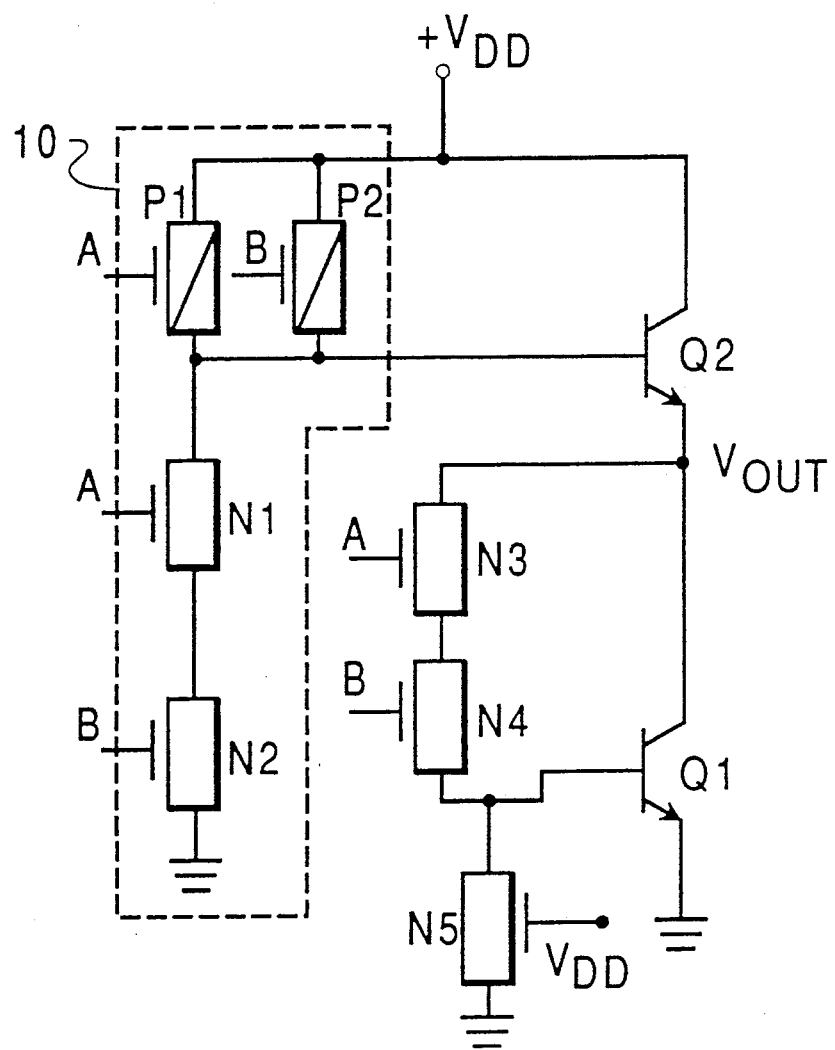
FIG. 1 is a circuit diagram for a 2-input NAND showing the prior art.
Figure 2:
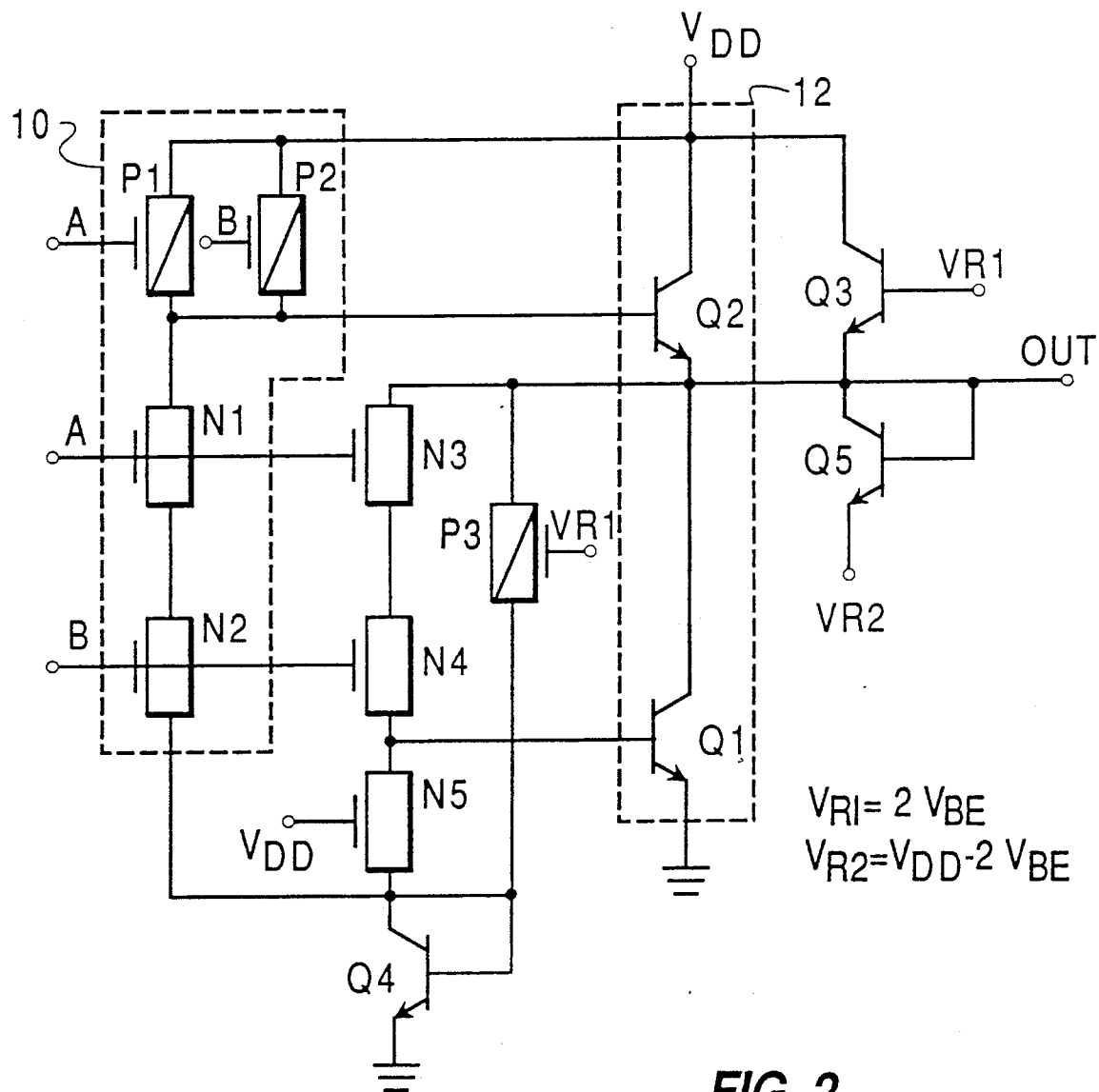
FIG. 2 is a state-of-the-art 2-input NAND having a clamped output.
Figure 3A:
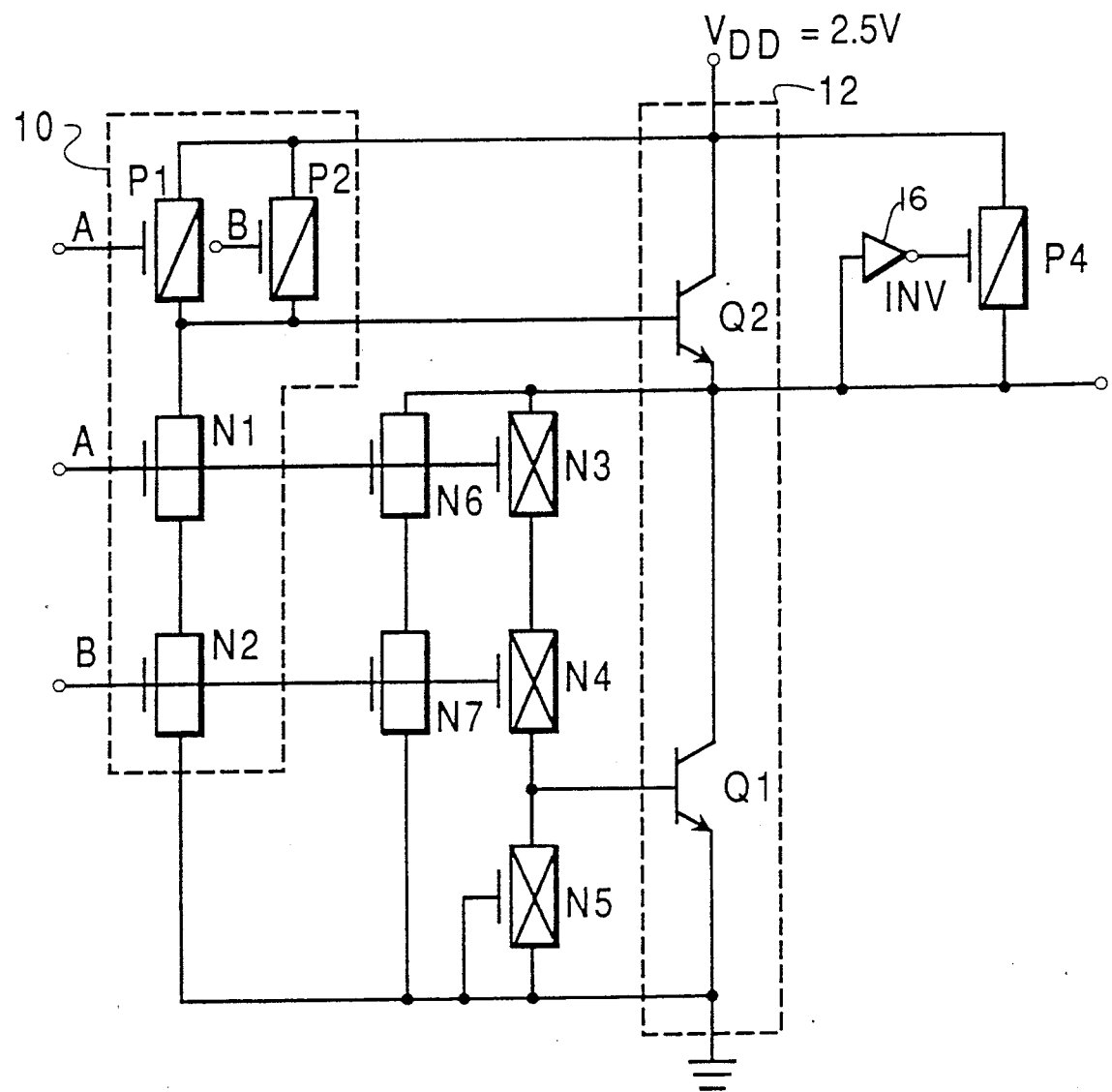
FIG. 3A is a circuit diagram of the invention showing a low threshold full swing NAND circuit.
Figure 3B:
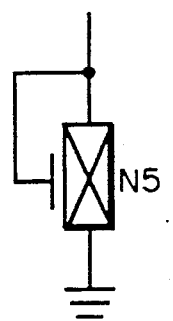
FIGS. 3B, C and D are alternate configurations for the bleed transistor of the circuit diagram of FIG. 3A.
Figure 3C:
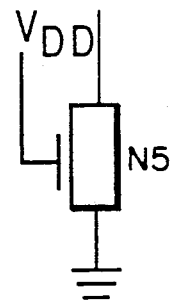
Figure 3D:
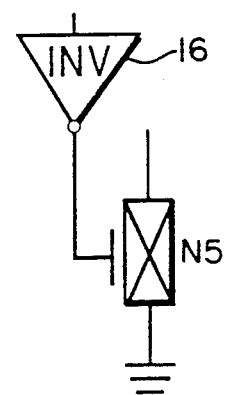

The static power dissipation of the circuit is essentially zero when the output is at ground. When the output is high, a small amount of static power is dissipated as the bleed current of N5 is drawn through P4, N3, and N4 from the power supply. This current is intentionally made small by making the N5 transistor a high impedance. There are several alternative ways to implement the bleed transistor N5. As shown in FIG. 3B, transistor N5 can have its gate tied to its drain. As shown in FIG. 3C, the gate of a standard threshold transistor can be tied to $V_{dd}$, or as shown in FIG. 3D, the output of the inverter 16 can be used to drive the gate of transistor N5.

The circuit provides good performance at the reduced power supply level of 2.5 volts. The rail-to-rail signal voltage swing provides complete signal level compatibility with conventional CMOS circuits which may be located on the same chip. Full CMOS levels also provide an increased noise margin over other BiCMOS circuit designs.

Figure 4A:
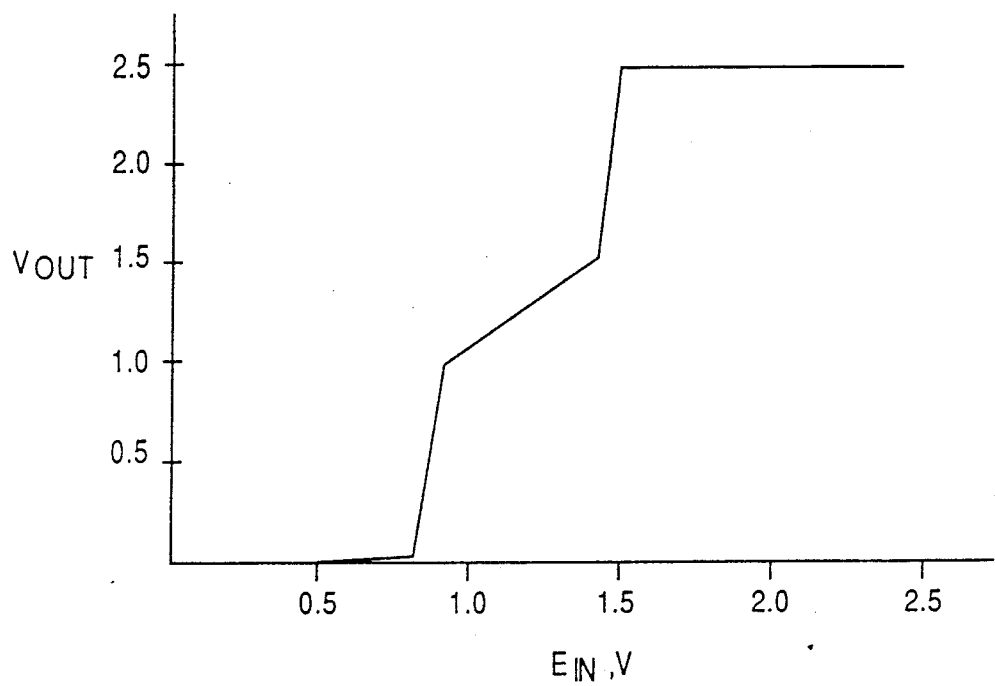
FIG. 4A is a plot of the input versus output voltage for the circuit shown in FIG. 3A.

FIG. 4A shows the input voltage versus the output voltage when low threshold transistors N3, N4, and N5 have a $-0.15$ volt threshold.

Figure 4B:
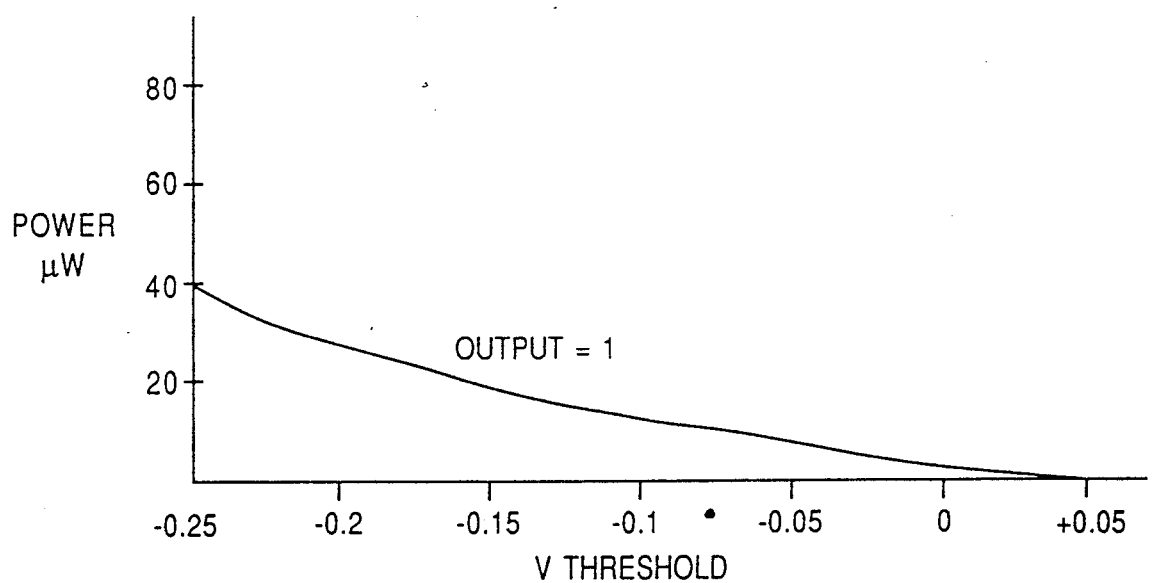
FIG. 4B is a plot of the power in a static mode versus the threshold voltage of the low threshold in n-channel transistors of circuit 3A.

The static power level for the output high state is shown in FIG. 4B for various bleeder transistor N5 (also N3 and N4) threshold voltages.

Although a specific embodiment of the invention has been disclosed, it will understood by those having skill in the art that changes can be made to that specific embodiment without departing from the spirit and the scope of the invention.

What is claimed is:

1. An improved BiCMOS logic circuit providing full rail-to-rail output voltage and high-speed operation comprising:
   a conventional CMOS NAND input stage;
   a push-pull output stage comprised of a series-connected pair of bipolar transistors driven by the CMOS NAND stage output;
   a series-connected pair of low threshold n-channel field effect transistors, which improve the output falling delay, connected between the base and collector terminals of the pull-down transistor of the bipolar push-pull output stage;
   a series-connected pair of standard threshold n-channel field effect transistors connected between the output and ground driven by the input signals;
   a p-channel field effect transistor connected between the output and a power supply, said p-channel FET driven by a standard CMOS inverter circuit which is connected to the output; and
   a low threshold n-channel field effect transistor with grounded gate and source terminals and drain terminal connected to the base terminal of the pull-down transistor of the bipolar push-pull output stage used as a bleed transistor.

2. The circuit of claim 1 wherein a bleed transistor with its gate and drain terminals shorted having a reduced threshold voltage level is connected between the base terminal of the pull-down transistor of the bipolar push-pull output stage and ground.

3. The circuit of claim 1 wherein a bleed transistor having a standard threshold voltage with its gate terminal connected to the power supply is connected between the base terminal of the pull-down transistor of the bipolar push-pull output stage and ground.

4. The circuit of claim 1 wherein a bleed transistor having a reduced threshold voltage with its gate driven by the CMOS inverter output is connected between the base terminal of the pull-down transistor of the bipolar push-pull output stage and ground.

* * * * *